(12) United States Patent
Takeuchi et al.

(10) Patent No.: US 12,180,580 B2
(45) Date of Patent: Dec. 31, 2024

(54) FILM FORMING POSITION MISALIGNMENT CORRECTION METHOD AND FILM FORMING SYSTEM

(71) Applicant: TOKYO ELECTRON LIMITED, Tokyo (JP)

(72) Inventors: Atsushi Takeuchi, Yamanashi (JP); Kazunaga Ono, Yamanashi (JP); Kanto Nakamura, Yamanashi (JP); Atsushi Gomi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/339,920

(22) Filed: Jun. 22, 2023

(65) Prior Publication Data

US 2024/0011148 A1 Jan. 11, 2024

(30) Foreign Application Priority Data

Jul. 5, 2022 (JP) ................. 2022-108677

(51) Int. Cl.
| | | |
|---|---|---|
| *C23C 14/34* | (2006.01) | |
| *C23C 14/04* | (2006.01) | |
| *C23C 14/54* | (2006.01) | |
| *H01J 37/34* | (2006.01) | |
| *H01J 37/32* | (2006.01) | |

(52) U.S. Cl.
CPC .......... *C23C 14/547* (2013.01); *C23C 14/042* (2013.01); *C23C 14/34* (2013.01); *H01J 37/3476* (2013.01); *H01J 37/32935* (2013.01); *H01J 37/3441* (2013.01); *H01J 37/3447* (2013.01)

(58) Field of Classification Search
CPC ............... H01J 37/3441; H01J 37/3447; H01J 37/3476; H01J 37/32935; C23C 14/547; C23C 14/042; C23C 14/34; C23C 16/52
USPC .......... 204/298.03, 298.11, 192.13; 118/665, 118/688
See application file for complete search history.

(56) References Cited

U.S. PATENT DOCUMENTS

| | | |
|---|---|---|
| 10,049,860 B2 | 8/2018 | Gomi et al. |
| 10,468,237 B2 | 11/2019 | Gomi et al. |
| 2015/0235815 A1 | 8/2015 | Gomi et al. |
| 2018/0315585 A1 | 11/2018 | Gomi et al. |

FOREIGN PATENT DOCUMENTS

| | | |
|---|---|---|
| JP | H06326172 A | 11/1994 |
| JP | 6160614 B2 | 7/2017 |
| JP | 2021-144022 A | 9/2021 |

*Primary Examiner* — Rodney G McDonald
(74) *Attorney, Agent, or Firm* — Fenwick & West LLP

(57) ABSTRACT

There is provided a film forming position misalignment correction method comprising: replacing a shielding member; loading a substrate into a film forming module by a transfer mechanism and forming a film on the substrate; detecting an amount of film forming position misalignment by transferring the substrate on which the film has been formed to a film thickness measuring device; correcting a transfer position of the substrate for the transfer mechanism; and checking the correction by transferring the substrate used for measuring the amount of film forming position misalignment to the film forming module by the transfer mechanism for which the transfer position has been corrected to form a film and determining the amount of film forming position misalignment by measuring a film thickness of the formed film by the film thickness measuring device in the same manner.

13 Claims, 8 Drawing Sheets

FILM FORMING POSITION MISALIGNMENT CORRECTION METHOD AND FILM FORMING SYSTEM

CROSS-REFERENCE TO RELATED APPLICATIONS

This application claims priority to Japanese Patent Application No. 2022-108677, filed on Jul. 5, 2022, the entire contents of which are incorporated herein by reference.

TECHNICAL FIELD

The present disclosure relates to a film forming position misalignment correction method and a film forming system.

BACKGROUND

For example, as a film forming system for forming a multilayer film on a substrate, Patent Document 1 discloses a system in which a plurality of processing modules for performing a film forming process are connected to a vacuum transfer chamber, and a substrate is sequentially transferred to each processing module by a transfer mechanism in the vacuum transfer chamber to form each film.

In a system having such a transfer mechanism, in order to transfer the substrate to a predetermined position on a substrate placing table in the processing module with high accuracy, teaching is performed to teach necessary information in advance (see, e.g., Patent Document 2).

Incidentally, generally, when a film forming process is performed on a substrate, a ring-shaped shielding member is provided to suppress film formation on an edge portion of the substrate on a substrate placing table, and the shielding member is replaced during device maintenance.

PRIOR ART DOCUMENTS

Patent Documents

Patent Document 1: Japanese Patent No. 6160614
Patent Document 2: Japanese Laid-open Patent Publication No. H6-326172

SUMMARY

The present disclosure provides a film forming position misalignment correction method and a film forming system that can more easily correct a film forming position misalignment when replacing a shielding member in a film forming module.

In accordance with an aspect of the present disclosure, there is provided a film forming position misalignment correction method comprising: replacing a shielding member in a film forming system including a film forming module having a substrate placing table on which a substrate is placed and the shielding member detachably provided so as to cover an edge portion of the substrate placed on the substrate placing table and forming a film on the substrate, a film thickness measuring device for in-situ measuring a film thickness of the film formed in the film forming module, and a transfer mechanism for transferring the substrate to the film forming module and the film thickness measuring device; loading the substrate into the film forming module by the transfer mechanism and forming a film on the substrate; detecting an amount of film forming position misalignment by transferring the substrate on which the film has been formed to the film thickness measuring device and measuring the film thickness at an edge of the substrate; correcting a transfer position of the substrate for the transfer mechanism to eliminate the film forming position misalignment; and checking the correction by transferring the substrate used for measuring the amount of film forming position misalignment to the film forming module by the transfer mechanism for which the transfer position has been corrected to form a film and determining the amount of film forming position misalignment by measuring a film thickness of the formed film by the film thickness measuring device in the same manner.

BRIEF DESCRIPTION OF THE DRAWINGS

FIGS. 8A and 8B are diagrams showing the profile of the difference between a film thickness measured after the transfer position is corrected by the transfer mechanism and a film thickness measured first, wherein FIG. 8A shows the misalignment $S_y$ in the A-C direction, which is the Y direction, and FIG. 8B shows the misalignment $S_x$ in the B-D direction, which is the X direction.

DETAILED DESCRIPTION

Figure 1:
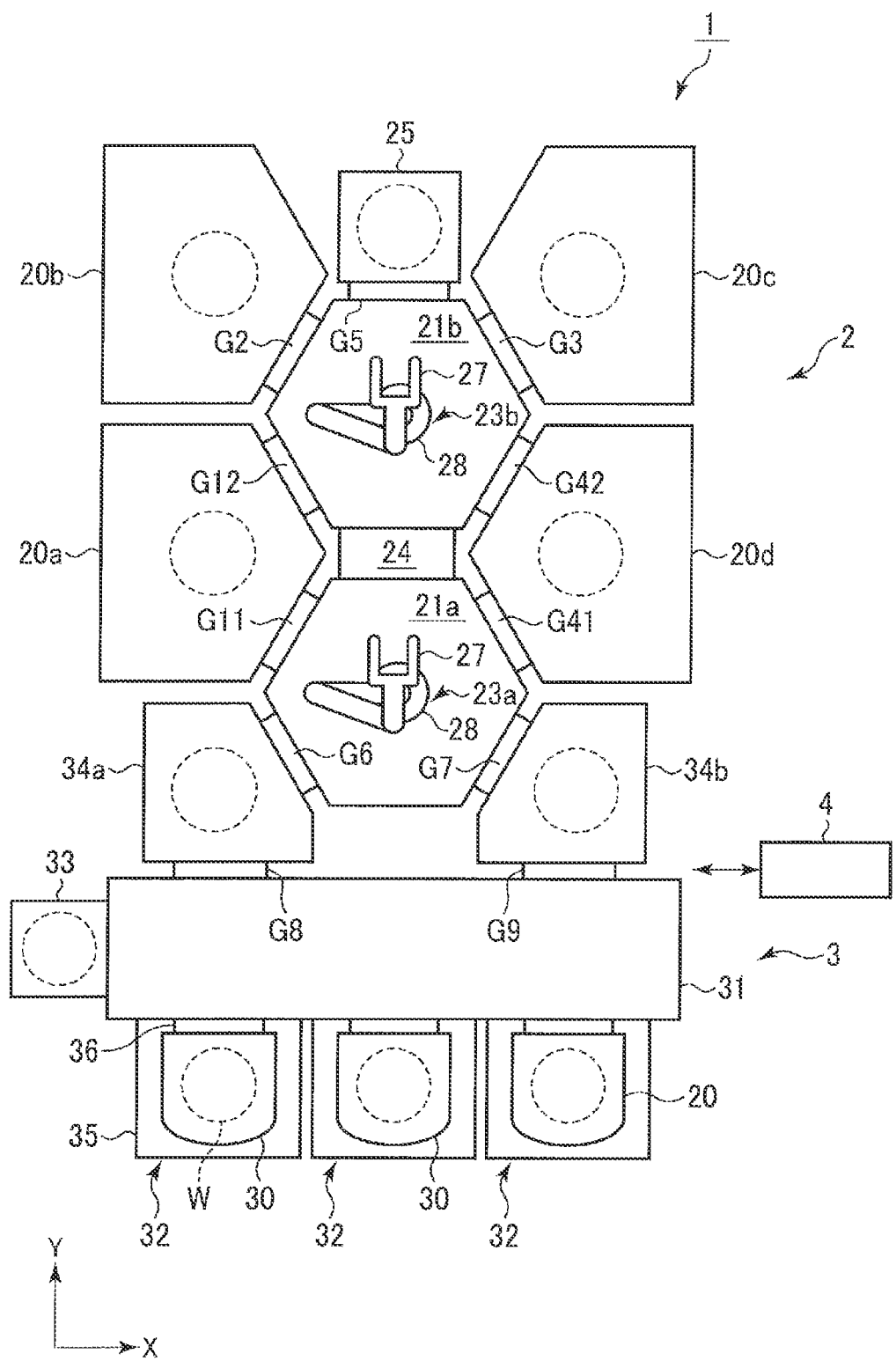
FIG. 1 is a plan view showing schematically an example of a film forming system equipped with a film thickness measuring device.

Embodiments are specifically described below with reference to the accompanying drawings.

BACKGROUND

First, the background is described.

In a film forming system, a substrate is transferred by a transfer device into a chamber of a film forming module and placed on a placing table in the chamber. At that time, the transfer device is taught and a transfer position of the substrate with respect to the placing table is adjusted to a desired position.

On the other hand, the placing table of the film forming module is provided with a shielding member for suppressing film formation on an edge portion of the substrate, and the shielding member is replaced during device maintenance. When the shielding member is replaced, an offset occurs in the mounting position of the shielding member, which may cause a film forming position misalignment, which is a misalignment of the film forming area, on the plane of the substrate. Therefore, conventionally, after replacing the shielding member, film formation is actually performed on the substrate, the film forming position misalignment amount is measured visually or by optical measurement after the substrate is unloaded from the film forming system, and the transfer device is corrected so as to eliminate the misalignment. Further, after correction, it is necessary to check whether the correction is appropriate, and if the misalignment is not eliminated, it is necessary to correct again, so it is necessary to perform film formation and measurement of the misalignment amount two or three times. At this time, since it is necessary to unload the substrate for the moment after film formation from the film forming system, it is necessary to discard the substrate for each measurement of the misalignment amount, and two or three substrates are required for each correction of the film forming position misalignment.

As described above, conventionally, it is necessary to unload the substrate from the film forming system to measure the misalignment amount, which is a complicated operation and lowers the throughput. In addition, it is necessary to repeat the film formation and the measurement of the misalignment amount two or three times to eliminate the film forming position misalignment, which requires a plurality of substrates.

Therefore, a film forming system equipped with an in-situ film thickness measuring device as described in Japanese Laid-open Patent Publication No. 2021-144022 is used to correct the film forming position misalignment based on the film thickness measurement result of the in-situ film thickness measuring device. That is, a film is formed on the substrate after the shielding member is replaced, the film thickness of the formed film is measured in-situ, the film forming position misalignment amount is measured from the result, and the film forming position misalignment is corrected by adjusting the transfer device so as to eliminate the misalignment. To check the correction, a film is formed again on the same substrate and the film thickness is measured by the film thickness measuring device. Further, if it is necessary to perform the correction again, a film is formed on the same substrate and the misalignment amount is measured in the same way.

This eliminates the need to unload the substrate from the film forming system to measure the film forming position misalignment amount, and allows the film forming position misalignment to be easily corrected with a small number of man-hours. Further, since the misalignment is measured by in-situ film thickness measurement, the film formation and the misalignment amount measurement can be repeated using a single substrate, and the film forming position misalignment can be corrected without using a plurality of substrates. In addition, since the film forming position misalignment amount is measured by in-situ film thickness measurement, the film forming rate can be derived based on the film thickness measurement at the same time as the film forming position misalignment amount is measured.

Specific Embodiment

[Film Forming System]

FIG. 1 is a plan view showing schematically an example of a film forming system equipped with a film thickness measuring device.

The film forming system 1 includes a processing part 2 that performs film forming process, a loading/unloading part 3 that holds a plurality of substrates and loads/unloads the substrate into/from the processing part 2, and a controller 4. Although the substrate is not particularly limited, a semiconductor substrate (semiconductor wafer) is exemplified.

The processing part 2 includes a plurality (four in the drawing) of film forming modules 20a, 20b, 20c, and 20d which perform film forming process on the substrate W, a plurality (two in the drawing) of transfer modules 21a and 21b which sequentially transfer the substrate W to the plurality of film forming modules 20a to 20d, and a film thickness measuring device 25 which measures a film thickness of the formed film.

The film forming modules 20a to 20d constitute a film forming apparatus that performs film forming process on the substrate W, and each film forming module performs film forming process to form a multilayer film on the substrate W. A plurality of films may be formed in one film forming module. Here, an example in which there are four film forming modules is shown, but the number is not limited to this and may be set to a necessary number according to the number of multilayer films to be laminated. Details of the film forming module are described later.

The transfer modules 21a and 21b have a hexagonal planar shape and are kept in a vacuum state inside. Transfer mechanisms 23a and 23b are provided in the transfer modules 21a and 21b, respectively.

Each of the transfer mechanisms 23a and 23b has a multi-joint structure and includes a transfer arm 27 that holds the substrate W and a base 28 that includes a driving part (not shown) that raises and lowers and rotates the transfer arm 27.

A buffer part 24 as a transfer buffer is provided between the transfer modules 21a and 21b, and the transfer modules 21a and 21b communicate with each other through the buffer part 24. The buffer part 24 is configured to be able to temporarily hold the substrate W.

The transfer modules 21a and 21b are arranged in the Y direction in the drawing, the film forming modules 20a and are provided on one side of the transfer modules 21a and 21b, and the film forming modules 20c and 20d are provided on the other side of the transfer modules 21a and 21b.

The film forming module 20a is connected to the transfer module 21a through a gate valve G11, and is connected to the transfer module 21b through a gate valve G12. The film forming module 20b is connected to the transfer module 21b through a gate valve G2. The film forming module 20c is connected to the transfer module 21b through a gate valve G3. The film forming module 20d is connected to the transfer module 21b through a gate valve G42, and is connected to the transfer module 21a through a gate valve G41.

The transfer mechanisms 23a and 23b can access the film forming modules 20a and 20d, and the transfer mechanism 23b can access the film forming modules 20b and 20c. The gate valves G11, G12, G2, G3, G41, and G42 are opened when the transfer mechanism accesses the corresponding film forming module and are closed during processing.

The film thickness measuring device 25 for measuring a film thickness of a film formed on the substrate W is connected to the tip of the transfer module 21b through a gate valve G5. The transfer mechanism 23b can access the film thickness measuring device 25, and the gate valve G5 is opened when the transfer mechanism 23b accesses the film thickness measuring device 25 and closed when a film thickness measuring process is performed.

The loading/unloading part 3 is connected to one end of the processing part 2. The loading/unloading part 3 includes an atmospheric transfer chamber (EFEM) 31, three load ports 32, an aligner module 33, and two load-lock modules 34a and 34b. The three load ports 32, the aligner module 33, and the two load-lock modules 34a and 34b are connected to the atmospheric transfer chamber 31. A transfer device (not shown) is provided in the atmospheric transfer chamber 31.

The atmospheric transfer chamber 31 has a rectangular parallelepiped shape, the longitudinal direction of which is the X direction in the drawing. The three load ports 32 are provided on a long side wall portion of the atmospheric transfer chamber 31 on the side opposite to the processing part 2. Each load port 32 has a placement table 35 and a transfer port 36, a front opening unified pod (FOUP) 30, which is a container for accommodating a plurality of substrates, is placed on the placement table 35, and the FOUP 30 on the placement table 35 is hermetically connected to the atmospheric transfer chamber 31 through the transfer port 36.

The aligner module 33 is connected to one short side wall portion of the atmospheric transfer chamber 31. The alignment of the substrate W is performed in the aligner module 33.

The two load-lock modules 34a and 34b are for enabling the transfer of the substrates W between the atmospheric transfer chamber 31, which is under atmospheric pressure, and the transfer modules 21a and 21b, which are under vacuum atmosphere, and are pressure variable between atmospheric pressure and vacuum. The load-lock module 34a has two transfer ports, one of which is connected to the long side wall portion of the atmospheric transfer chamber 31 facing the processing part 2 through a gate valve G8, and the other of which is connected to the transfer module 21a through a gate valve G6. The load-lock module 34b also has two transfer ports, one of which is connected to the long side wall portion of the atmospheric transfer chamber 31 facing the processing part 2 through a gate valve G9, and the other of which is connected to the transfer module 21a through a gate valve G7. The gate valves G6, G7, G8, and G9 are opened when the transfer mechanism 23a or a transfer device (not shown) accesses the corresponding load-lock module and are closed during a pressure change operation.

The load-lock module 34a is used when the substrate W is transferred from the loading/unloading part 3 to the processing part 2, and the load-lock module 34b is used when the substrate W is transferred from the processing part 2 to the loading/unloading part 3.

The transfer mechanism 23a in the transfer module 21a can access the load-lock modules 34a and 34b, the film forming modules 20a and 20d, and the buffer part 24. The transfer mechanism 23b in the transfer module 21b can access the film forming modules 20a, 20b, 20c, and 20d and the buffer part 24.

The transfer mechanism in the atmospheric transfer chamber 31 can access the FOUP 30 and the load-lock modules 34a and 34b. Specifically, an unprocessed substrate W is taken out of the FOUP 30, the substrate W is transferred to the load-lock module 34a, a processed substrate W transferred from the processing part 2 to the load-lock module 34b is received, and the substrate W is transferred to the FOUP 30.

The film thickness measuring device 25 measures in-situ a film thickness of a film formed in a specific film forming module. The position of the film thickness measuring device is not limited to the position in this example. The number of film thickness measuring devices 25 may be plural. The details of the film thickness measuring device 25 will be described later.

The controller 4 controls each component of the film forming system 1, such as the transfer mechanisms 23a and 23b, the film forming modules 20a to 20d, the load-lock modules 34a and 34b, the gate valves, the film thickness measuring device 25, and the like. The controller 4 is configured by a computer and includes a main controller having a CPU, an input device, an output device, a display device, and a storage device. The storage device is provided with a storage medium in which processing recipes are stored. The main controller causes the film forming system 1 to perform a predetermined operation based on the processing recipes called from the storage medium.

The storage device stores the coordinates of the transfer arms of the transfer mechanisms 23a and 23b when the substrate W is placed at a desired position on the placing table of the film forming module, which are obtained by teaching using a position sensor such as an optical sensor. Based on the coordinates, the main controller controls the transfer mechanisms 23a and 23b to transfer the substrate W to the film forming module.

In the film forming system 1 configured as described above, the film forming process for the substrate is performed under the control of the controller 4 as follows.

First, the substrate W is taken out of the FOUP 30 and transferred to the load-lock chamber 34a by the transfer mechanism in the atmospheric transfer chamber 31. Then, the substrate W in the load-lock chamber 34a is taken out by the transfer mechanism 23a and subjected to a series of film forming processes in the processing part 2.

Specifically, the substrate W taken out of the load-lock chamber 34a is transferred to the film forming module 20a by the transfer mechanism 23a, and the film forming process is performed on the substrate W in the film forming module 20a. After the film forming process in the film forming module 20a, the substrate in the film forming module 20a is taken out and transferred to the film forming module 20b by the transfer mechanism 23b, and the film forming process is performed on the substrate W in the film forming module 20b. After the film forming process in the film forming module 20b, the substrate W in the film forming module 20b is taken out and transferred to the film forming module 20c by the transfer mechanism 23b, and the film forming process is performed on the substrate W in the film forming module 20c. After the film forming process in the film forming module 20c, the substrate W in the film forming module 20c is taken out and transferred to the film forming module 20d by the transfer mechanism 23b, and the film forming process is performed on the substrate W in the film forming module 20d.

After the film forming process is completed in the film forming module 20d, the substrate is transferred to the load-lock chamber 34b by the transfer mechanism 23a. Then, the substrate W in the load-lock chamber 34b is returned to the FOUP 30 by the transfer mechanism in the atmospheric transfer chamber 31.

The film forming process described above is sequentially performed on a plurality of substrates. However, when a desired transfer is difficult due to the state of the transfer mechanisms 23a and 23b, the substrate W is temporarily retracted to the buffer part 24.

In the process of forming a multilayer film as described above, if necessary, the film thickness of the formed film is measured in-situ by the film thickness measuring device 25, as described later. Further, the film forming position misalignment is corrected based on the film thickness measurement by the film thickness measuring device 25.

[Film Forming Module]

Next, the film forming module is described in detail.

Figure 2:
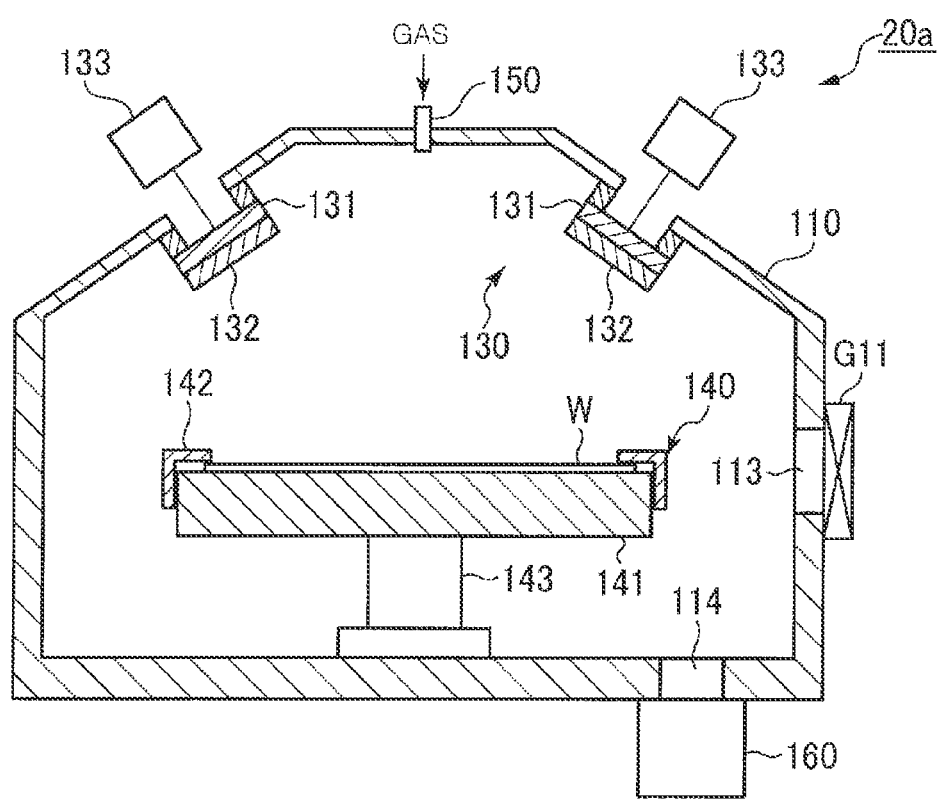
FIG. 2 is a cross-sectional view showing an example of a film forming module installed in the film forming system.

FIG. 2 is a cross-sectional view schematically showing an example of the film forming module 20a. The film forming modules 20b to 20d are similarly configured.

The film forming module 20a is configured as a film forming apparatus that forms a film on a substrate by sputtering.

As shown in FIG. 1, the film forming module 20a includes a chamber 110, a sputtered particle discharging part 130, a substrate placing part 140, a gas introduction port 150, and an exhaust mechanism 160.

The chamber 110 accommodates the substrate W and is configured to maintain the interior in a vacuum. An upper portion of the chamber has sloped sides. The gas introduction port 150 is provided at a top of the chamber 110. A gas necessary for sputtering film formation (for example, a noble gas such as argon, krypton, neon, or nitrogen gas) is supplied from the gas introduction port 150. A loading port 113 for loading the substrate is formed in a side wall of the chamber 110. The loading port 113 is opened and closed by the gate valve G11. Although not shown, an unloading port for unloading the substrate is also formed in the side wall of the chamber 110, and the unloading port is opened and closed by the gate valve G12.

The sputtered particle discharging part 130 includes a plurality (two in the drawing) of target holders 131, a plurality of targets 132 held by each target holder 131, and a plurality of power supplies 133 for applying voltage to each target holder 131.

The target holder 131 is composed of a component of a film to be formed, and is attached to the upper sloped side of the chamber 110 via an insulating member. The target holder 131 holds the target 132 so that the target 132 is positioned obliquely above the substrate W held on the substrate placing part 140.

The plurality of power supplies 133 are electrically connected to each of the plurality of target holders 131. A voltage (for example, DC voltage) is applied from the power supply 133 to the target holder 131, thereby dissociating sputtering gas around the target 132. Then, the dissociated ions in the sputtering gas collide with the target 132, and the target 132 discharges sputtered particles which are particles of its constituent material.

One target holder 131 and one target 132 may be provided.

The substrate placing part 140 includes a substrate placing table 141 on which the substrate W is placed, and a shielding member 142 provided on the periphery of the substrate placing table 141. The shielding member 142 is for suppressing film formation on the edge portion of the substrate W, has a ring shape, is provided above the substrate W placed on the substrate placing table 141 so as to cover the edge portion of the substrate W, and is detachable. A raising/lowering pin (not shown) for raising and lowering the substrate W is provided inside the substrate placing table 141 so as to protrude from an upper surface of the substrate placing table 141. The substrate placing table 141 is rotatable by a rotating mechanism (not shown). The substrate placing table 141 may be provided with an electrostatic chuck on its upper surface. A temperature control mechanism, such as a heater, may be provided inside the substrate placing table 141.

The exhaust mechanism 160 is connected to an exhaust port 114 provided at the bottom of the chamber 110. The exhaust mechanism 160 includes a vacuum pump capable of reducing the pressure in the chamber 110 to a vacuum, and an automatic pressure control valve.

In the film forming module 20a configured as described above, the gate valve G11 is opened and the substrate W is loaded into the chamber 110 through the loading port 113 by the transfer mechanism 23a.

Next, the sputtering gas is introduced into the chamber 110 from the gas introduction port 150, and the inside of the chamber 110 is controlled to a predetermined vacuum pressure by the exhaust mechanism 160 to perform the sputtering film formation. The sputtering film formation is performed by applying a voltage from the power supply 133 to the target holder 131, and causing ions in the sputtering gas dissociated around the target 132 to collide with the target 132. That is, when the ions collide with the target 132, the sputtered particles are discharged and the sputtered particles are obliquely incident on a surface of the substrate W and deposited on the substrate W. At this time, the sputtering film formation is performed while the substrate placing table 141 is rotated by the rotating mechanism (not shown), whereby more uniform film formation can be performed.

After the film forming process is completed, the chamber 110 is purged by introducing the sputtering gas as a purge gas from the gas introduction port 150 into the chamber 110. Thereafter, the gate valve G12 (see FIG. 1) is opened and the substrate W is unloaded from the unloading port (not shown) by the transfer mechanism 23b of the transfer module 21b.

[Film Thickness Measuring Device]

Next, the film thickness measuring device 25 will be described in detail.

Figure 3:
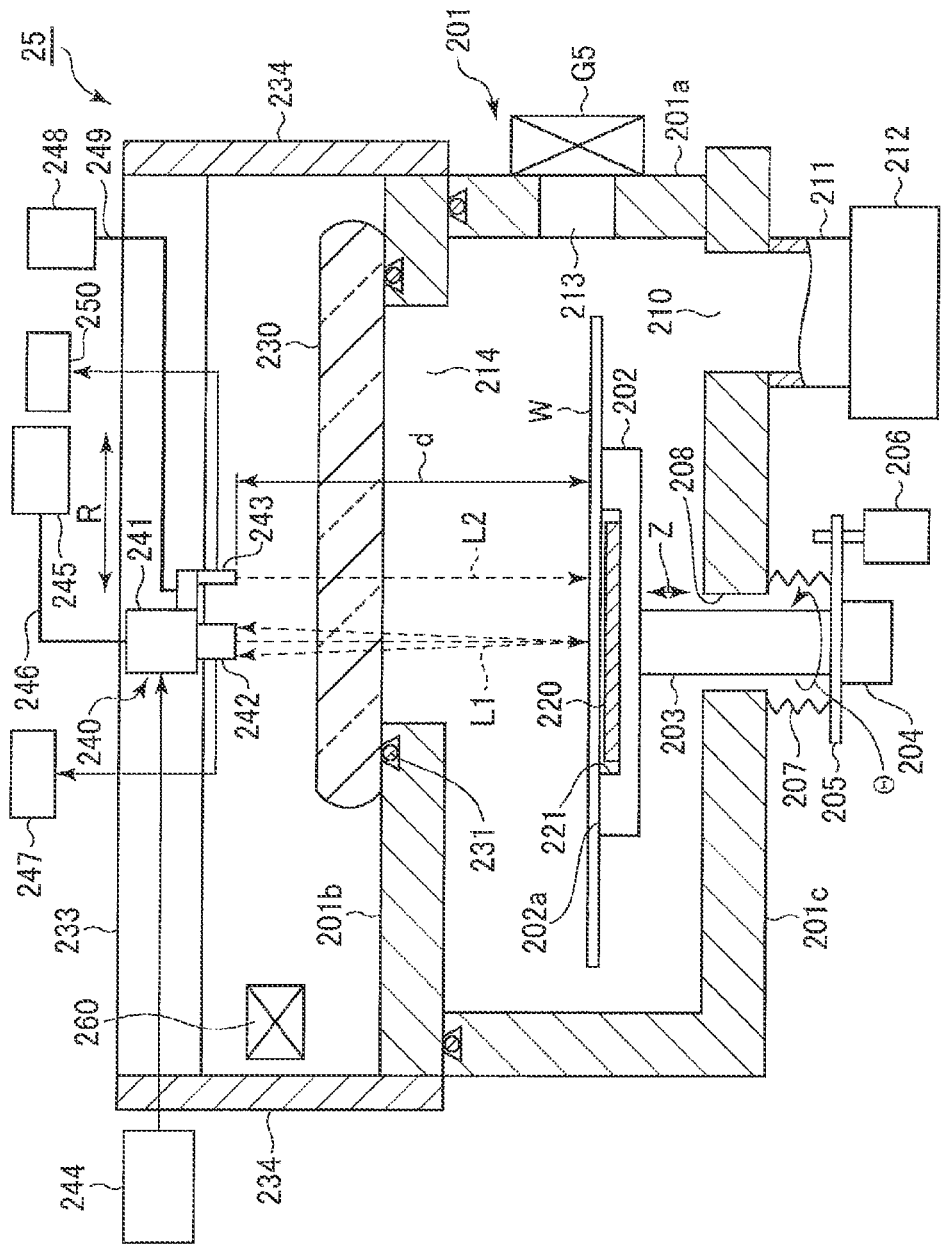
FIG. 3 is a cross-sectional view showing an example of the film thickness measuring device installed in the film forming system.

FIG. 3 is a cross-sectional view showing an example of the film thickness measuring device 25. As shown in FIG. 3, the film thickness measuring device 25 of this example includes a chamber 201. In the chamber 201, a stage 202 is provided on which the substrate W is placed and which can rotate and move up and down. A shaft 203 is connected to the center of the bottom surface of the stage 202. The shaft 203 extends downwardly from the chamber 201 through a through hole 208 formed in a bottom wall 201c of the chamber 201 and is connected to a rotating mechanism 204. The stage 202 is rotated by the rotating mechanism 204 via the shaft 203. The rotating mechanism 204 has a motor and an absolute encoder connected to the motor. The absolute encoder functions as an orientation detector that detects the orientation of the stage 202, and the orientation of the stage 202 is controlled by the controller 4 of the film forming system 1 based on the detection result of the absolute encoder. The rotating mechanism 204 is attached to a raising/lowering plate 205 to which a raising/lowering mechanism 206 is connected. The raising/lowering mechanism 206 is composed of, for example, a piezoelectric actuator, and can finely adjust the height position of the stage 202 via the raising/lowering plate 205 and the shaft 203. An expandable/contractible bellows 207 is airtightly provided between the bottom wall 201c and the raising/lowering plate 205 so as to surround the shaft 203.

An exhaust port 210 is formed in the bottom wall 201c of the chamber 201, an exhaust pipe 211 is connected to the exhaust port 210, and an exhaust mechanism 212 including an automatic pressure control valve and a vacuum pump is connected to the exhaust pipe 211. By operating the exhaust mechanism 212, the inside of the chamber 201 is brought to a desired vacuum state.

A substrate loading/unloading port 213 is provided in a side wall 201a of the chamber 201, and the substrate loading/unloading port 213 can be opened and closed by the gate valve G5 described above.

A ceiling wall (lid) 201b of the chamber 201 is formed with an elongated through hole 214 extending in the radial direction of the substrate W. The through hole 214 is covered with a light-transmitting member 230 made of, for example, quartz, through which light for film thickness measurement and laser for distance measurement, which will be described later, are transmitted. A seal ring 231 seals between the light-transmitting member 230 and the ceiling wall 201b.

A recess 221 is formed on an upper surface of the stage 202, and a reference member 220 is disposed in the recess 221. The reference member 220 is made of the same material as a base portion (base) of the substrate W, such as silicon when the substrate W is a silicon substrate, and is used for measuring an output light amount of a light source. The reference member 220 is also used as a reference for the film thickness measurement. Further, the stage 202 is provided with a raising/lowering pin (not shown) for transferring the substrate so as to be able to protrude from a surface of the stage 202. A heater for heating the substrate W may be provided in the stage 202.

A light emitting/receiving assembly 240 is provided in an atmospheric region above the position corresponding to the through hole 214 of the chamber 201. The light emitting/receiving assembly 240 includes a main body 241, a measuring light emitting/detecting unit 242, and a distance measuring laser emitting/detecting unit 243. The measuring light emitting/detecting unit 242 and the distance measuring laser emitting/detecting unit 243 are attached to the main body 241 so as to be adjacent to each other. A linear guide 233 that guides the main body 241 is disposed horizontally above the chamber 201 while being supported by the ceiling wall 201b of the chamber 201 with a support member 234.

The main body 241 is configured as a slider guided by the linear guide 233 and driven by a driving motor 144. Thereby, the entire light emitting/receiving assembly 240 including the measuring light emitting/detecting unit 242 and the distance measuring laser emitting/detecting unit 243 is configured to be scanned horizontally along the linear guide 233. The light emitted from the measuring light emitting/detecting unit 242 and the laser light emitted from the distance measuring laser emitting/detecting unit 243 are irradiated onto the substrate W through the light-transmitting member 230 and the through hole 214, and the irradiation points can be scanned in the radial direction (R direction). Since the substrate W on the stage 202 is rotated by the rotating mechanism 204, the irradiation points of the light emitted from the measuring light emitting/detecting unit 242 and the laser light emitted from the distance measuring laser emitting/detecting unit 243 can be scanned on the substrate W in the circumferential direction (8 direction). That is, the driving motor 244 and the rotating mechanism 204 function as a moving mechanism that moves the irradiation points on the substrate of the light emitted from the measuring light emitting/detecting unit 242 and the laser light emitted from the distance measuring laser emitting/detecting unit 243.

The measuring light emitting/detecting unit 242 includes a light emitting part that emits light L1 for film thickness measurement toward the substrate W, and a light receiving sensor that detects reflected light of the emitted light. Light is guided from a light source part 245 to the light emitting part through an optical fiber 246. The light source part 245 includes a light source, an amplifier that amplifies light from the light source, an optical system, a sensor, and the like. A lamp light source that emits short-wave broad light in the visible light region with a wavelength of 200 to 800 nm can be used as the light source. The reflected light spectrum of the substrate W is measured using such a light source. By using such short-wave broad light, it is possible to measure the thickness of an extremely thin film of 0.1 to nm by spectroscopic interferometry.

The light receiving sensor receives reflected light emitted from the light emitting part and reflected from the substrate W. A detection signal detected by the light receiving sensor is sent to a film thickness gauging part 247, and the film thickness of the film on the substrate W is gauged. The measuring light emitting/detecting unit 242, the light source part 245, the optical fiber 246, and the film thickness gauging part 247 constitute a film thickness measuring part.

The distance measuring laser emitting/detecting unit 243 includes a laser emitting part that emits laser L2 for distance measurement downward (toward the stage 202), and a distance measuring light receiving sensor that receives reflected light of the laser. A laser beam is guided from a laser light source part 248 to the laser emitting part through an optical fiber 249. A detection signal detected by the distance measuring light receiving sensor is sent to a distance gauging part 250, and a distance d between the light receiving sensor of the measuring light emitting/detecting unit 242 and the substrate W is gauged. The distance measuring laser emitting/detecting unit 243, the laser light source part 248, the optical fiber 249, and the distance gauging part 250 constitute a laser distance meter.

A cooling fan 260 is provided above the chamber 201 for cooling the light emitting/receiving assembly 240. The cooling fan 260 is particularly effective when the stage 202 is heated by the heater.

A cover may be provided on an optical path of the measuring light emitting/detecting unit 242 and the distance measuring laser emitting/detecting unit 243. By providing the cover, it is possible to prevent the sensor or the like from being adversely affected by light leakage.

In the film thickness measuring device 25 configured as described above, the film thickness of the film formed on the substrate W is measured in the following procedure.

First, the inside of the chamber 201 is maintained at the same vacuum pressure as that of the transfer module 21b by the exhaust mechanism 212, and the film thickness measuring part (the measuring light emitting/detecting unit 242) and the laser distance meter (the distance measuring laser emitting/detecting unit 243) are turned on.

Next, a reference measurement is performed by raising the stage 202 to align a surface of the reference member 220 with a measurement plane and irradiating the reference member 220 with light for film thickness measurement from the light source of the light source part 245 through the measuring light emitting/detecting unit 242. That is, by irradiating the reference member 220 with light from the light source of the light source part 245, the output light amount of the light source is measured and it is checked whether or not the light source output is within the standard.

Next, distances in the Z direction to the measurement points on the substrate W are measured. At this time, a reference position of the substrate W is first measured. For example, if the substrate W is a semiconductor wafer, a notch alignment is performed. Next, a height position of the surface of the substrate W is moved to the measurement plane. Next, distances to a plurality of film thickness measurement positions on the substrate W, that is, distances (Z direction distances) between the light receiving sensor of the measuring light emitting/detecting unit 242 and the irradiation points on the substrate W, are measured by the distance measuring laser emitting/detecting unit 243. At this time, by adjusting an R directional position (R coordinate) of the distance measuring laser emitting/detecting unit 243 by the driving motor 244 and adjusting a θ directional position (θ coordinate) of the substrate W by the rotating mechanism 204, the plurality of film thickness measurement positions are sequentially irradiated with the laser for distance measurement.

Next, the film thickness is actually measured as follows at the film thickness measurement position where the Z direction distance was measured.

First, a position of the measuring light emitting/detecting unit 242 is adjusted by the driving motor 244 and an angle of the substrate W is adjusted by the rotating mechanism 204. As a result, the R-Θ coordinate of the irradiation point where the substrate W is irradiated with the light from the measuring light emitting/detecting unit 242 is adjusted to one of the plurality of film thickness measurement positions. Next, the Z direction distance is corrected by the raising/lowering mechanism 206 based on the measurement result of the distance (Z direction distance) between the light receiving sensor and the irradiation point (film thickness measurement position) by the laser distance meter (distance measuring laser emitting/detecting unit 243). Next, the substrate is irradiated with the light from the light emitting part of the film thickness measuring part (measuring light emitting/detecting unit 242), the reflected light from the irradiation point (film thickness measuring position) is detected by the light receiving sensor to measure the reflected light spectrum, and the film thickness at the position is measured by spectroscopic interferometry. Next, in a similar manner, the R-Θ coordinate of the irradiation point of the light from the measuring light emitting/detecting unit 242 onto the substrate W is sequentially adjusted to other plural film thickness measurement positions, and the film thickness measurement is performed at other plural film thickness measurement positions by sequentially correcting the Z direction distance of the film thickness measurement positions. The substrate W is unloaded after the film thickness measurement at all the measurement points is completed.

In this example, when measuring the film thickness by spectroscopic interferometry, it is preferable to use short-wave broad light in the visible light region with a wavelength of 200 to 800 nm as the measuring light. This makes it possible to measure the thickness of an extremely thin film with a thickness of 0.1 to 10 nm.

[Film Forming Position Misalignment Correction Method]

Figure 4:
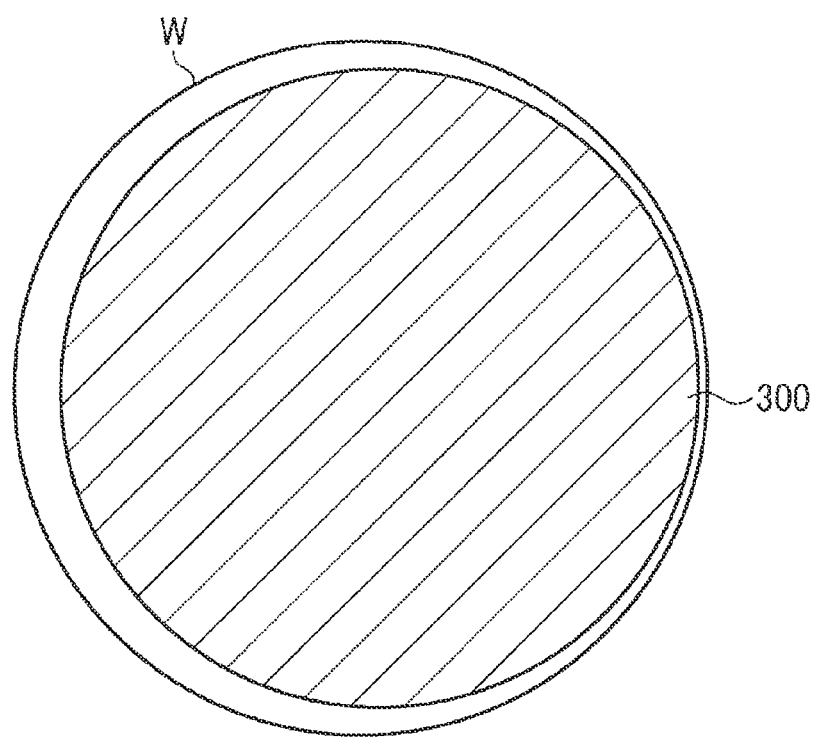
FIG. 4 is a schematic diagram showing misalignment of a film forming area when a shielding member is replaced.

The shielding members 142 of the film forming modules 20a to 20d are replaced during maintenance of the film forming system 1. When a new shielding member 142 is attached, the attaching position may be misaligned. In this case, the film forming position misalignment, which is a misalignment of a film forming area, occurs in the plane of the substrate W. FIG. 4 shows an example of such a film forming position misalignment. Due to the misalignment of the attaching position of the shielding member 142, a film forming area 300, which should originally exist evenly in the center of the substrate W, is formed unevenly on the surface of the substrate W as shown in FIG. 4, thereby causing the film forming position misalignment.

It is necessary to correct such a film forming position misalignment, but since this film forming position misalignment is caused by the position misalignment between the shielding member 142 and the transfer position of the substrate, it does not become apparent until the film is actually formed on the substrate W.

For this reason, conventionally, film formation is actually performed on the substrate after the shielding member is replaced, the misalignment amount of the film forming range is measured visually or by optical measurement after the substrate on which the film is formed is unloaded from the film forming system, and the coordinate of the transfer device is adjusted to eliminate the misalignment.

In this case, it is necessary to unload the substrate from the film forming system in order to measure the misalignment amount, and it is also necessary to form a film with a thickness of about 20 nm in order to measure the misalignment amount. Therefore, the operation becomes complicated and the throughput is reduced. In addition, it is necessary to repeat the film formation and the measurement of the misalignment amount two or three times to eliminate the film forming position misalignment, which requires a plurality of substrates. Moreover, it is necessary to perform such adjustment of the transfer mechanism for all transfer paths, which results in a long total work time.

On the other hand, in one embodiment, the film forming system 1 including the in-situ film thickness measuring device is used, and the film forming position misalignment is corrected based on the film thickness measurement result of the film thickness measuring device 25.

Figure 5:
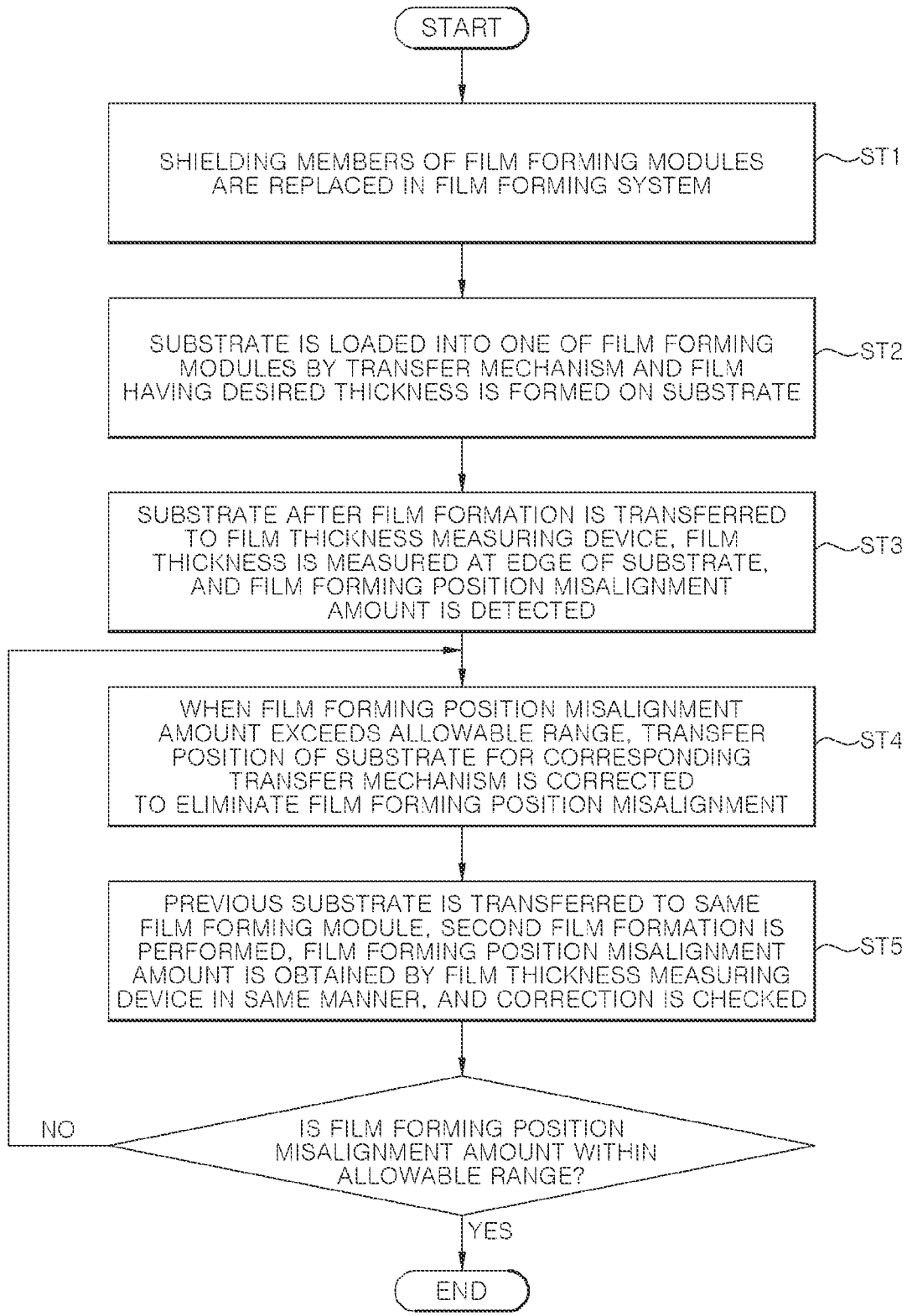
FIG. 5 is a flow chart showing a procedure of a film forming position misalignment correction method.

A specific description is given below. FIG. 5 is a flow chart showing a procedure of a film forming position misalignment correction method.

First, in the film forming system 1 equipped with the in-situ film thickness measuring device 25, the shielding members 142 of the film forming modules 20a to 20d are replaced (ST1).

Next, the substrate W is loaded into one of the film forming modules 20a to 20d by the transfer mechanism 23a or 23b, and a film having a desired thickness is formed on the substrate W (ST2).

Next, the substrate W after film formation is transferred to the film thickness measuring device 25, the film thickness is measured at an edge of the substrate W, and the film forming position misalignment amount is detected (ST3).

Figure 6:
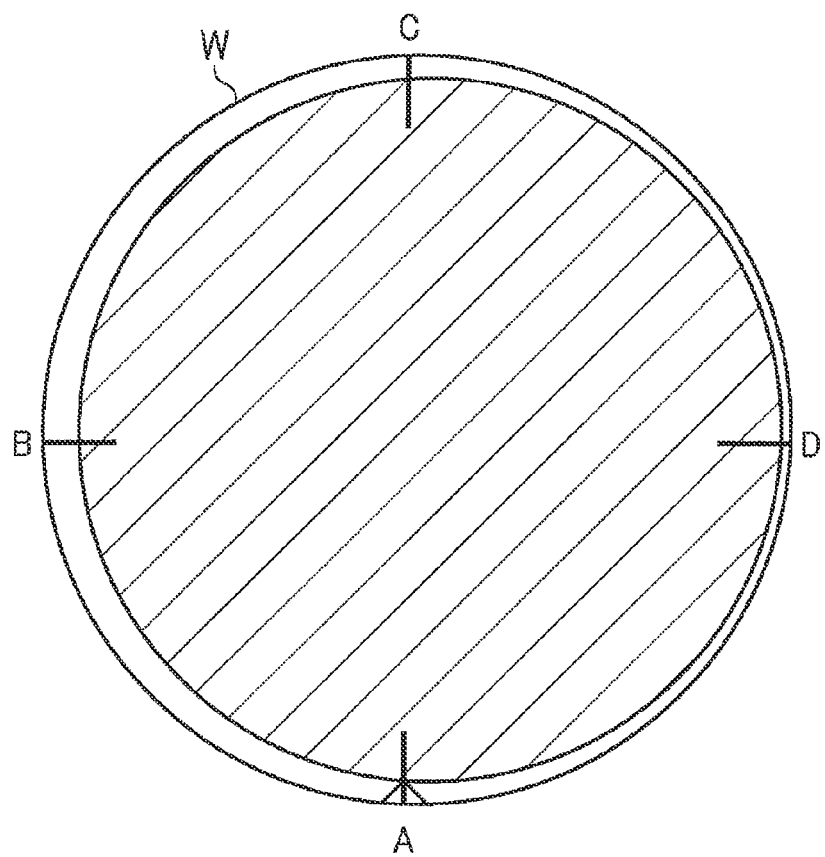
FIG. 6 is a schematic diagram showing an example of how to obtain a film forming position misalignment amount on a substrate.

As mentioned above, film thickness measurement can be performed by spectroscopic interferometry. For example, the film thickness measurement for detecting the film forming position misalignment amount is performed as follows. First, the film thickness is measured at a plurality of locations on the edge of the substrate W, for example, in the radial direction. As a result, a position of a boundary portion between a region where the film is formed and a region where the film is not formed can be obtained. From this position of the boundary portion, a length of the region where the film is not formed at the edge of the substrate is obtained, and the film forming position misalignment amount is detected from a deviation of this length of the region. For example, as shown in FIG. 6, the film thickness is measured in the radial direction at four locations A, B, C, and D at intervals of ° at the edge of the substrate W, and the misalignment amount in the X direction and the Y direction of the region where the film is not formed at the edge of the substrate is obtained assuming that B-D is the X direction and A-C is the Y direction.

Then, when the film forming position misalignment amount exceeds an allowable range, the transfer position of the substrate W for the corresponding transfer mechanism is corrected to eliminate the film forming position misalignment (ST4). Specifically, the coordinate of the corresponding transfer mechanism stored in the storage device of the controller 4 is corrected and the transfer position of the substrate W is corrected.

Next, the previous substrate W used for measuring the film forming position misalignment amount is transferred to the same film forming module by the transfer mechanism for which the transfer position has been corrected, a second film formation is performed, the film forming position misalignment amount is obtained by the film thickness measuring device 25 in the same manner, and the correction is checked (ST5).

At this time, an actual film thickness profile of the film formed by the second film formation is obtained by taking the difference between the film thickness measurement result at the edge of the substrate after the second film formation and the film thickness measurement result at the edge of the substrate after the first film formation. Thus, the film forming position misalignment amount of the second film formation can be obtained.

If the film forming position misalignment is within the allowable range, the correction sequence of the film forming position misalignment ends. On the other hand, if the film forming position misalignment amount still exceeds the allowable range, the above ST4 and ST5 are performed until the film forming position misalignment amount falls within the allowable range.

Such film forming position misalignment correction is performed for the transfer paths of all film forming modules.

As described above, in the present embodiment, since the in-situ film thickness measuring device 25 can measure the film forming position misalignment amount without unloading the substrate W from the film forming system 1, it is possible to easily correct the film forming position misalignment with a small number of man-hours. Further, since the misalignment is measured by the in-situ film thickness measurement, the film formation and the misalignment amount measurement can be repeated using a single substrate, and the film forming position misalignment can be corrected without using a plurality of substrates. In addition, since the film forming position misalignment amount is measured by the in-situ film thickness measuring device 25, the film forming rate can be derived based on the film thickness measurement at the same time as the film forming position misalignment amount is measured.

Experimental Example

An experimental example is described next.

Here, a Ru film was formed to a thickness of 10 nm by the film forming module (see FIG. 2) of the film forming system 1 shown in FIG. 1 using a 300 mm silicon substrate having a 300 nm thermal oxide film formed on its surface, then the substrate was transferred to the film thickness measuring device 25, and the film thickness at the edge of the substrate was measured by spectroscopic interferometry.

Specifically, as shown in FIG. 6 described above, the film thickness was measured in the radial direction at four locations A, B, C, and D at intervals of 90° at the edge of the substrate W, and the misalignment amount in the X direction and the Y direction of the region where the film is not formed at the edge of the substrate was obtained assuming that B-D is the X direction and A-C is the Y direction.

Figure 7A:
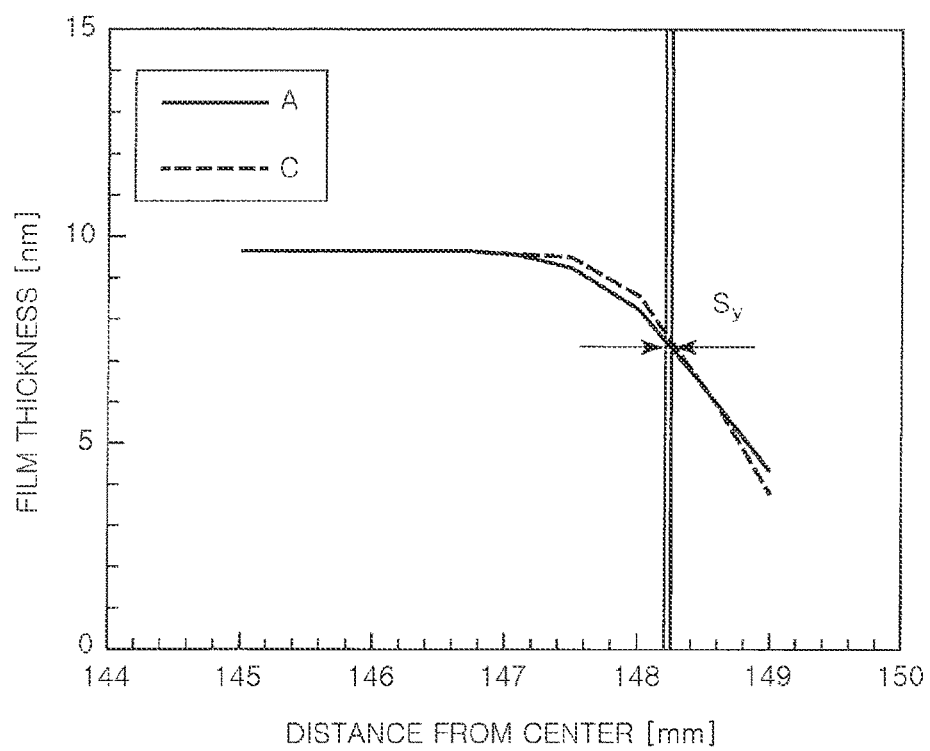
FIGS. 7A and 7B are diagrams showing the results of actually using FIG. 6 to obtain a misalignment $S_y$ in the A-C direction, which is the Y direction, and a misalignment $S_x$ in the B-D direction, which is the X direction, before correcting a transfer position by a transfer mechanism.
Figure 7B:
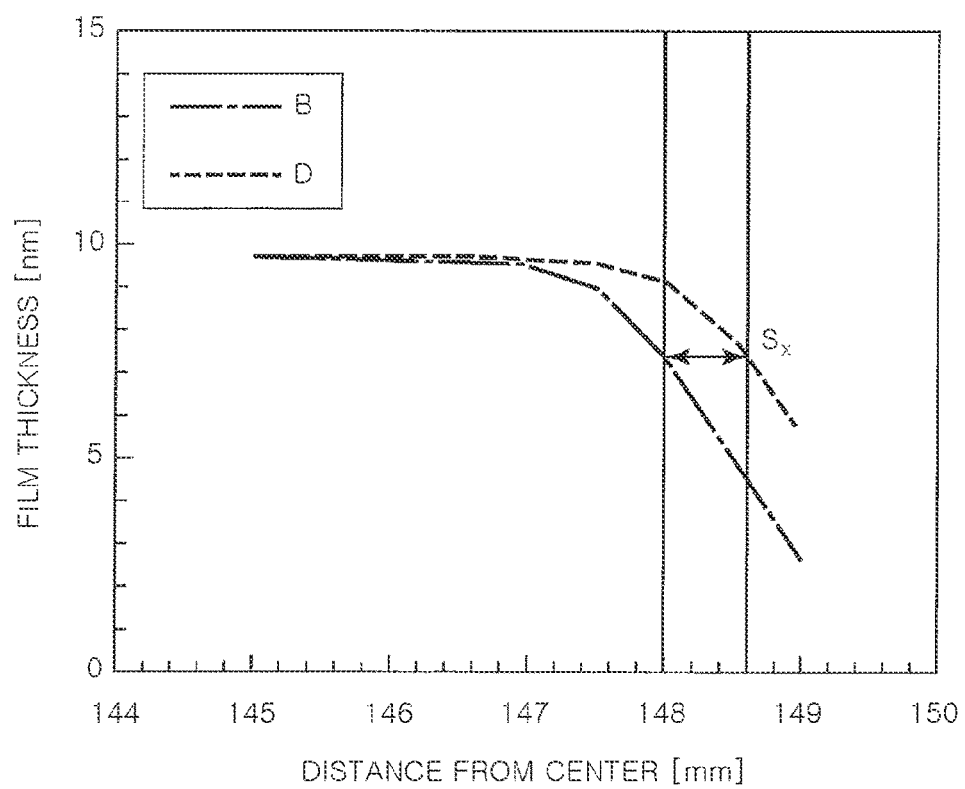

FIG. 7A is a diagram showing a misalignment $S_y$ in the A-C direction, which is the Y direction, and FIG. 7B is a diagram showing a misalignment $S_x$ in the B-D direction, which is the X direction. It can be seen from FIGS. 7A and 7B that there is almost no misalignment $S_y$ in the A-C direction, and the misalignment $S_x$ in the B-D direction is about 0.3 mm from the center of the substrate to the D side.

The film forming misalignment amounts $S_x$ and $S_y$ were calculated from the film thickness profile of the edge of the substrate, and the transfer position for the transfer mechanism was corrected so that the region where the film is not formed at the edge of the substrate is uniform at A to D.

Then, the substrate for which the misalignment amount was determined was transferred to the previous film forming module by the adjusted transfer mechanism, a Ru film having a thickness of 5 nm was further formed on the substrate, the substrate was transferred to the film thickness measuring device 25 again to measure the film thickness at the edge of the substrate in the same manner by spectroscopic interferometry, and the correction was checked.

Figure 8A:
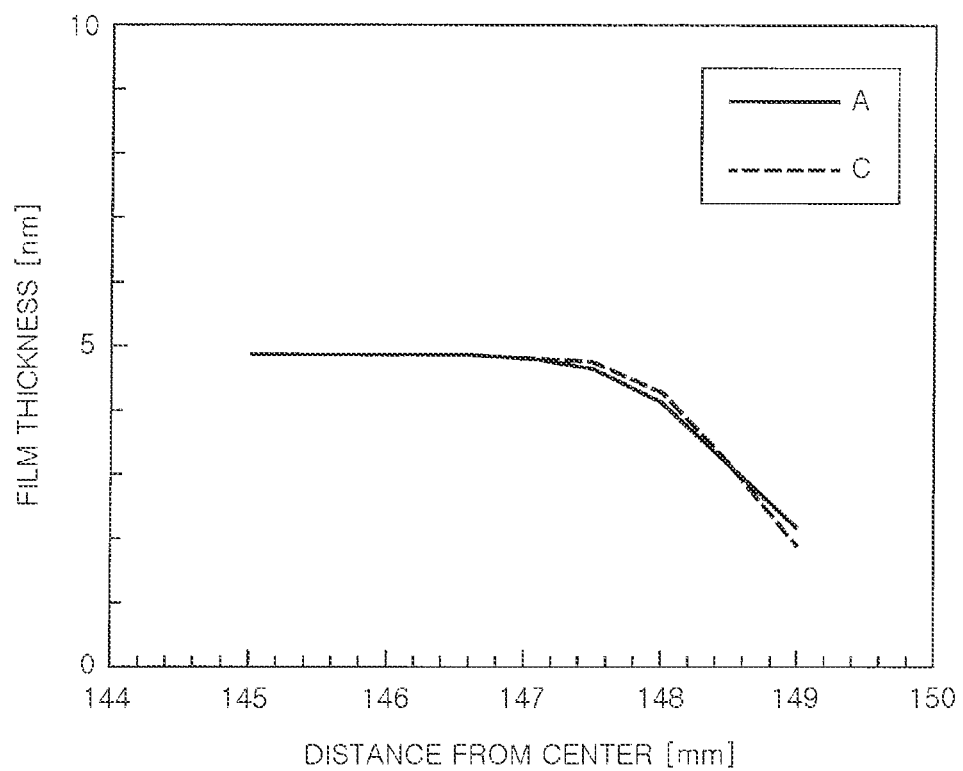
Figure 8B:
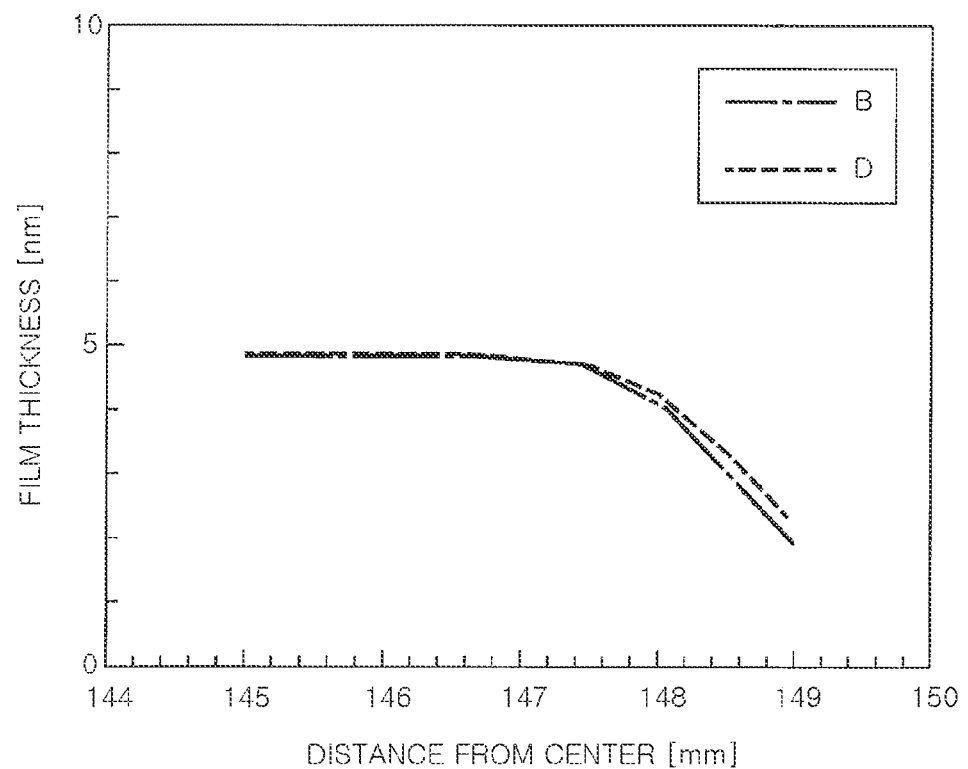

FIGS. 8A and 8B are diagrams showing the profile of the difference between the film thickness measured after the correction and the film thickness measured initially, FIG. 8A showing the misalignment $S_y$ in the A-C direction, which is the Y direction, and FIG. 8B showing the misalignment $S_x$ in the B-D direction, which is the X direction. It can be seen from FIGS. 8A and 8B that a state in which there is almost no misalignment $S_y$ in the A-C direction is maintained, and the misalignment $S_x$ in the B-D direction is also almost eliminated. From this, it is confirmed that the film forming position misalignment due to the position misalignment of the shielding member 142 has been eliminated from the film thickness measurement at the edge of the substrate by the film thickness measuring device 25.

OTHER APPLICATIONS

Although the embodiments have been described above, the embodiments disclosed herein should be considered as examples and not restrictive in all respects. The embodiments described above may be omitted, substituted, or modified in various ways without departing from the scope and spirit of the appended claims.

For example, in the embodiments described above, the film forming system having the plurality of film forming modules and the plurality of transfer mechanisms was used to correct the film forming position misalignment during the replacement of the shielding member, but the number of film forming modules and transfer mechanisms is not limited and may be one.

Further, in the above-described embodiments, the film forming module that forms a film by sputtering is exemplified, but the film forming module is not limited thereto, and any film forming module can be applied as long as the shielding member is provided so as to cover the edge portion of the substrate. Further, the film type and film thickness of the film formed on the substrate are not limited to those of the above embodiments.

The invention claimed is:

1. A film forming position misalignment correction method comprising:
  replacing a shielding member in a film forming system including a film forming module having a substrate placing table on which a substrate is placed and the shielding member detachably provided so as to cover an edge portion of the substrate placed on the substrate placing table and forming a film on the substrate, a film thickness measuring device for in-situ measuring a film thickness of the film formed in the film forming module, and a transfer mechanism for transferring the substrate to the film forming module and the film thickness measuring device;
  loading the substrate into the film forming module by the transfer mechanism and forming a film on the substrate;
  detecting an amount of film forming position misalignment by transferring the substrate on which the film has been formed to the film thickness measuring device and measuring the film thickness at an edge of the substrate;

correcting a transfer position of the substrate for the transfer mechanism to eliminate the film forming position misalignment; and checking the correction by transferring the substrate used for measuring the amount of film forming position misalignment to the film forming module by the transfer mechanism for which the transfer position has been corrected to form a film and determining the amount of film forming position misalignment by measuring a film thickness of the formed film at the end of the substrate by the film thickness measuring device.

2. The film forming position misalignment correction method of claim 1, wherein when it is confirmed in said checking the correction that the amount of film forming position misalignment is not within an allowable range, said correcting the transfer position and said checking the correction are performed again.

3. The film forming position misalignment correction method of claim 1, wherein in said detecting the amount of film forming position misalignment, a position of a boundary portion between a region where the film is formed and a region where the film is not formed at the edge of the substrate is obtained by the film thickness measuring device, a length of the region where the film is not formed at the edge of the substrate is obtained from the position of the boundary portion, and the amount of film forming position misalignment is detected from a deviation of the length of the region where the film is not formed.

4. The film forming position misalignment correction method of claim 3, wherein in said detecting the amount of film forming position misalignment, the length of the region where the film is not formed at the edge of the substrate is obtained in two directions perpendicular to each other, and the amount of film forming position misalignment is detected from the deviation of the length of the region where the film is not formed.

5. The film forming position misalignment correction method of claim 1, wherein an actual film thickness profile of the film formed on the substrate is obtained by taking a difference between a film thickness measurement result in said checking the correction and a film thickness measurement result in said detecting the amount of film forming position misalignment, and the amount of film forming position misalignment in said checking the correction is obtained from the actual film thickness profile.

6. The film forming position misalignment correction method of claim 1, wherein said correcting the transfer position is performed by correcting coordinates of the transfer mechanism stored in a controller of the film forming system.

7. The film forming position misalignment correction method of claim 1, wherein when performing said detecting the amount of film forming position misalignment, a film forming rate is simultaneously derived based on a film thickness measurement result by the film thickness measuring device.

8. The film forming position misalignment correction method of claim 1, wherein the film thickness measuring device measures reflected light spectrum of the substrate and obtains the film thickness of the film by spectroscopic interferometry.

9. A film forming system comprising:
a film forming module having a substrate placing table on which a substrate is placed and a shielding member detachably provided so as to cover an edge portion of the substrate placed on the substrate placing table and forming a film on the substrate;
a film thickness measuring device for in-situ measuring a film thickness of the film formed in the film forming module;
a transfer mechanism for transferring the substrate to the film forming module and the film thickness measuring device; and
a controller,
wherein the controller performs control to execute:
replacing the shielding member;
loading the substrate into the film forming module by the transfer mechanism and forming a film on the substrate;
detecting an amount of film forming position misalignment by transferring the substrate on which the film has been formed to the film thickness measuring device and measuring the film thickness at an edge of the substrate;
correcting a transfer position of the substrate for the transfer mechanism to eliminate the film forming position misalignment; and
checking the correction by transferring the substrate used for measuring the amount of film forming position misalignment to the film forming module by the transfer mechanism for which the transfer position has been corrected to form a film and determining the amount of film forming position misalignment by measuring a film thickness of the formed film at the edge of the substrate by the film thickness measuring device.

10. The film forming system of claim 9, wherein when it is confirmed in said checking the correction that the amount of film forming position misalignment is not within an allowable range, the controller controls to perform said correcting the transfer position and said checking the correction again.

11. The film forming system of claim 9, wherein the controller corrects the transfer position by correcting coordinates of the transfer mechanism stored in the controller of the film forming system.

12. The film forming system of claim 9, wherein when said detecting the amount of film forming position misalignment is performed, the controller simultaneously derives a film forming rate based on a film thickness measurement result by the film thickness measuring device.

13. The film forming system of claim 9, wherein the film thickness measuring device measures reflected light spectrum of the substrate and obtains the film thickness of the film by spectroscopic interferometry.

* * * * *